United States Patent [19]

Tiwari et al.

[11] Patent Number: 5,757,038
[45] Date of Patent: May 26, 1998

[54] SELF-ALIGNED DUAL GATE MOSFET WITH AN ULTRANARROW CHANNEL

[75] Inventors: Sandip Tiwari, Ossining; Samuel Jonas Wind, White Plains, both of N.Y.

[73] Assignee: International Business Machines Corporation, Armonk, N.Y.

[21] Appl. No.: 554,558

[22] Filed: Nov. 6, 1995

[51] Int. Cl.⁶ ............... H01L 31/0328; H01L 31/0336; H01L 29/80
[52] U.S. Cl. ............................... 257/192; 257/280
[58] Field of Search .................... 257/192, 194, 257/279, 280, 327, 328

[56] References Cited

U.S. PATENT DOCUMENTS

| | | | |
|---|---|---|---|
| 4,460,910 | 7/1984 | Chappell et al. | 257/192 |
| 4,550,489 | 11/1985 | Chappell et al. | 437/15 |
| 4,670,768 | 6/1987 | Sunami et al. | 257/369 |
| 4,791,462 | 12/1988 | Blanchard et al. | 257/377 |
| 4,835,586 | 5/1989 | Cogan et al. | 257/327 |
| 4,903,089 | 2/1990 | Hollis et al. | 437/90 |
| 4,903,189 | 2/1990 | Ngo et al. | 363/127 |
| 5,106,778 | 4/1992 | Hollis et al. | 257/192 |
| 5,115,289 | 5/1992 | Hisamoto et al. | 257/350 |
| 5,155,571 | 10/1992 | Wang et al. | 257/192 |
| 5,155,657 | 10/1992 | Oehrlein et al. | 361/313 |
| 5,214,301 | 5/1993 | Kosa et al. | 257/329 |
| 5,283,456 | 2/1994 | Hsieh et al. | 257/347 |
| 5,324,673 | 6/1994 | Fitch et al. | 437/40 |
| 5,340,759 | 8/1994 | Hsieh et al. | 257/329 |
| 5,362,972 | 11/1994 | Yazawa et al. | 257/26 |

FOREIGN PATENT DOCUMENTS 5-167114  7/1993  Japan.

OTHER PUBLICATIONS

Frank et al; "Monte Carlo Simulation of a 30 nm Dual Gate MOSFET . . . "; IEDM Digest; 1992; pp. 553–556.

Godbey et al., "Fabrication of Bond and Etch Back Silicon on Insulator Using SiGe–MBE and Selective Etching Techniques," Mat. Res. Soc. Symp. Proc., vol. 220, 1991, pp. 291–295.

Liu et al., "Self–Limiting Oxidation for Fabricating Sub–5 nm Silicon Nanowires," Appl. Phys. Lett., vol. 14, No. 11, Mar. 14, 1994, pp. 1383–1385.

*Primary Examiner*—Wael Fahmy
*Attorney, Agent, or Firm*—Scully, Scott, Murphy & Presser

[57] ABSTRACT

A dual gate field effect transistor with an ultra thin channel of substantially uniform width formed by a self-aligned process utilizing selective etching or controlled oxidation between different materials to form a vertical channel extending between source and drain regions, having a thickness in the range from 2.5 nm to 100 nm.

28 Claims, 2 Drawing Sheets

0
5,757,038

1

SELF-ALIGNED DUAL GATE MOSFET WITH AN ULTRANARROW CHANNEL

BACKGROUND OF THE INVENTION

1. Field of the Invention

The present invention is directed to semiconductor field effect transistors having very small dimensions, and more particularly, to a dual gate vertical transistor having a very narrow and very short channel. The field effect transistors of the present invention are self-aligned heterojunction devices formed by a sequence of thin film deposition, etching and/or oxidation.

2. Discussion of the Prior Art

Scaling of silicon field effect transistors, such as metal oxide semiconductor field effect transistors (MOSFET) to their theoretically predicted miniaturization limits cannot be accomplished by simply shrinking all device features to specified dimensions. New device features are required. Frank et al., 1992, IEDM Technical Digest, page 553, have modeled a device which extends the scaling limit to gate lengths as short as 30 nm. The Frank et al. simulated device is a horizontal, dual gate MOSFET having a 30 nm gate length and a channel thickness of 5 nm. However, heretofore, there have been no straightforward modifications to convention MOSFET fabrication schemes which would result in the dual gate structure as required by the Frank et al. theoretical model.

A dual gate heterojunction semiconductor device is disclosed in U.S. Pat. No. 4,460,910 to Chappell et al. The Chappell et al. device is a MESFET vertical transistor in which the channel is a web having a thickness controlled by electrolytic etching using a photogenerated carrier current. This electrochemical etching is a self-limiting process that does not permit the control necessary to produce a very thin uniform channel width. Lateral etching using different materials is disclosed in U.S. Pat. 5,155,657 to Oehrlein et al. for a high area capacitor. The capacitor has alternating first and second regions, such as silicon and nonsilicon regions, for example, germanium or carbon. The etch characteristics of the alternating regions are utilized to selectively etch lateral trenches to increase the surface area and capacitance of the capacitor.

SUMMARY OF THE INVENTION

The present invention is directed to an ultra thin and ultra short channel vertical MOSFET in the form of a pillar with source, drain, gate and channel regions defined by planar thin film techniques. The MOSFET of the present invention is a dual gate field effect transistor comprising a first region of first semiconductor material having a first conductivity type forming a source, a second region of second semiconductor material having a second conductivity type forming a channel, and a third region of third semiconductor material having the first conductivity type forming a drain. The channel which extends from the first region to the third region has first and second opposed sidewalls that are spaced apart substantially uniformly and in the range from 2.5 to 100 nm. The first and third semiconductor materials may be of the same or different materials but both are different from the second semiconductor material to form a heterojunction between the channel and the source and drain. First and second gate regions are positioned on the first and second sidewalls respectively of the channel region.

The dual gate field effect transistor of the present invention is self-aligned and requires only one level of high resolution lithography. The critical device features are formed by a sequence of thin film deposition, etching and/or oxidation. These processes are combined to yield a device with channel lengths as low as 30 nm and lower and with a channel thickness as low as 5 nm and lower. Such a device would meet the criteria of device models at the limits of MOSFET scaling for room temperature and liquid nitrogen temperature operation.

The dual gate field effect transistor of the present invention is formed by starting with a three-layer film consisting of first, second and third layers of semiconductor material in which the first and third layers are different from the second layer to form a heterojunction structure. The first and third layers have a first conductivity type and the second layer has a second conductivity type. The third layer is etched to form a pillar region on the second layer, and the second layer is etched to form a stacked pillar region on the first layer. A portion of the second layer of the stacked pillar region is selectively removed to form a narrow channel extending between the first and third layers. The channel can be formed either by selective etching or selective oxidation. The thickness of the second layer controls the length of the channel and the selective removal controls the width and shape of the channel. First and second gate regions are formed on opposed sidewalls of the channel, respectively.

DETAILED DESCRIPTION OF THE INVENTION

Figure 1:
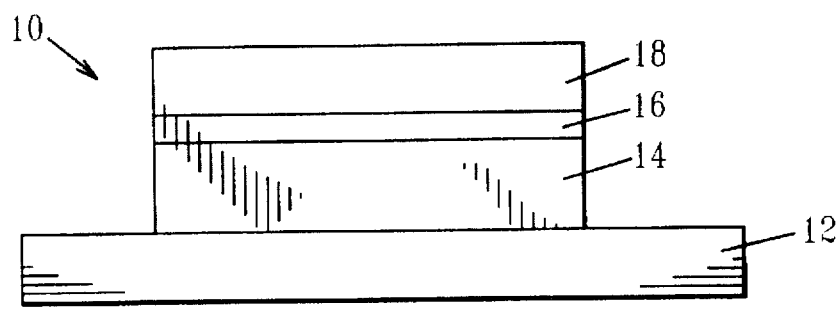
FIG. 1 is a side elevational view of a three-layer thin film used as the starting material in the formation of the field effect transistor of the present invention.

The present invention is directed to a dual gate field effect transistor having an ultra thin and ultra short channel which includes means for providing short channel effect immunity. The dual gates formed one on either side of the channel influence the same electrons in the thin channel for higher speeds and to avoid short channel effects. In a preferred embodiment, a metal oxide semiconductor field effect transistor (MOSFET) is formed. The dual gate MOSFET of the present invention can be scaled to have a channel with substantially uniformly spaced sidewalls and a thickness in the range from 2.5 to 100 nm. In addition, the length of the channel can be in the range from less than 200 nm to less than 30 nm. The dual gate MOSFET of the present invention is a vertical transport device that has the active area determined by a single level of high resolution lithography. All other key features of the device are fabricated by a combination thin film deposition, etching and/or oxidation so that the device is entirely self-aligned. The ultra thin channel is formed by selective etching or oxidation of the channel layer. The source, drain and channel doping may be performed in situ during layered deposition, so that the source/channel and drain/channel heterojunctions may be nearly atomically abrupt.

Referring now to the drawings, the key process steps for fabricating a MOSFET dual gate device of the present invention are described. Initially, the active layers are deposited resulting in a three-layer film 10 formed on substrate 12. Film 10 consists of a first layer 14 of a first semiconductor material, a second layer 16 of a second semiconductor material, and a third layer 18 of a third semiconductor material. Layer 16 may be epitaxially grown on layer 14, and layer 18 may be epitaxially grown on layer 16. The second semiconductor material is different from the first and third semiconductor materials thereby forming heterojunctions between the first and second layers and between the second and third layers. The first and third semiconductor materials may be of the same or different materials as long as the heterojunctions are formed. In one embodiment, the first and third layers 14, 18 are comprised of SiGe while the second layer 16 is comprised of Si. In an alternative embodiment, the first and third layers 14, 18 are comprised of Si and the second layer 16 is comprised of SiGe.

The upper and lower layers 14, 18 are heavily doped (either n or p type) with concentrations required for source and drain formation, such as for example in the range between $0.8 \times 10^{18}/cm^3$ to $10^{20}/cm^3$. The doping may be done either during deposition or a later stage in the processing. The middle layer 16 will form the channel layer and the thickness of this layer will determine the channel length. Thus, for a device having for example a channel length of 50 nm, the thickness of layer 16 should be 50 nm. The thickness of the upper and lower layers 14, 18 is not critical.

Figure 2:
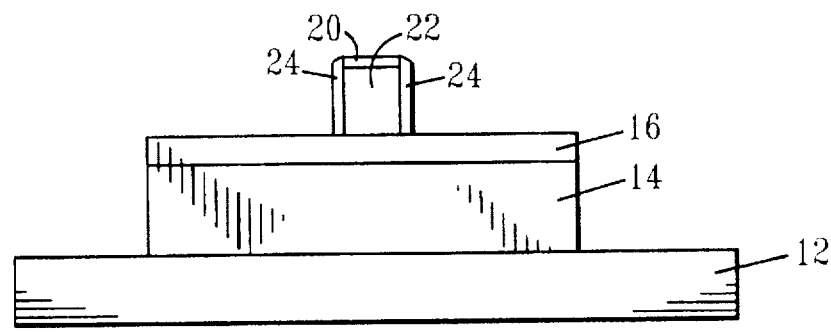
FIG. 2 shows the formation of a pillar region on the middle layer of the structure of FIG. 1.
Figure 3:
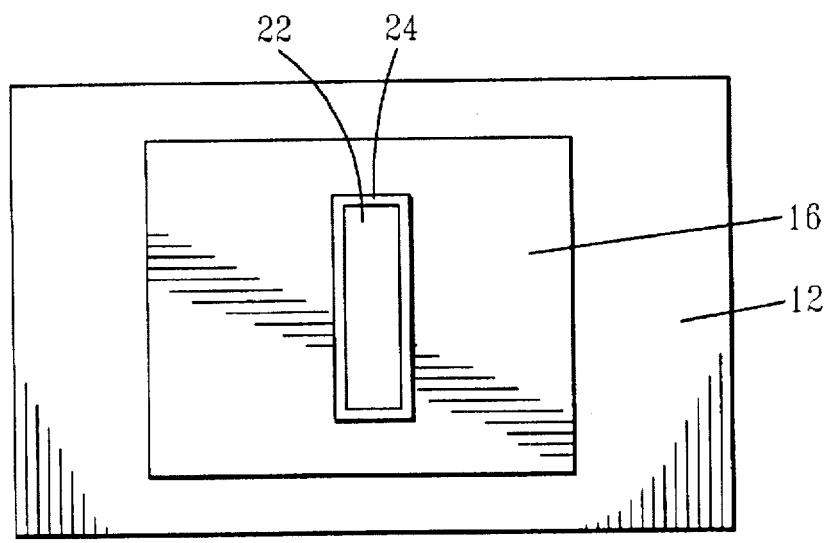
FIG. 3 is a top view of the structure of FIG. 2.

A thin layer of dielectric film 20, such as silicon nitride ($Si_3N_4$) or silicon dioxide ($SiO_2$) is deposited on top layer 18 as an etch mask and protection layer for subsequent processing steps. Fine lithography determines the active area of the device and delineates the basis for subsequent processing steps. Initially, as shown in FIG. 2, reactive ion etching (RIE) of top layer 18 forms a pillar region 22. The next step is the formation of a dielectric sidewall surrounding the region 22 by conformal deposition and etchback. It should be noted that the sidewall 24 may not be required if the channel formed in later processing steps is done by selective etching. An example of how the sidewall 24 surrounds the pillar region 22 is seen in FIG. 3.

Next, a second reactive ion etching is performed which etches the middle layer 16. This RIE step stops at the bottom layer 14 and forms the stacked pillar consisting of regions 22 and 26.

The formation of the channel region 28 is achieved by the selective removal of material from region 26 of the stacked pillar by selective etching or by carefully controlled oxidation. Selective etching may be performed for example as shown in the article by Godbey et al., Mat. Res. Soc. Symp. Proc., 220, 291 (1991). In one specific illustrative embodiment, if the channel layer 28 is comprised of SiGe and region 22 and layer 14 are comprised of Si, the SiGe material may be selectively etched relative to the Si layers in a etchant such as $HNO_3:H_2O:HF(0.5\%)$ (40:20:5), with an etch rate ratio of about 11:1. If for example the channel layer 28 is comprised of Si and region 22 and layer 14 are comprised of SiGe, the channel layer 28 may be etched relative to the SiGe layers in an etchant such as $KOH:K_2Cr_2O_7:propanol:H_2O$, with an etch rate ratio of about 19 :1.

Controlled oxidation is an alternative method for forming the channel region 28. If controlled oxidation is used to consume silicon from the channel layer, removal of the oxide that is formed may be achieved by a wet chemical edge in hydrofluoric acid. For a narrow pillar, this process is self-limiting as shown in the article by Liu et al., Appl. Phys. Lett., 64, 1382 (1994). The thickness of the channel 28 remaining after the oxidation is determined by the thickness of the stacked pillar region 26 prior to oxidation (which was determined by the fine lithography described above) and the oxidation conditions.

Channels as thin as 2.5 nm may be obtained with the selective etch or controlled oxidation processes. In addition, the sidewalls of the channel formed by the processes above are spaced apart substantially uniformly. In the preferred embodiment, the channel thickness is in the range of 2.5 nm to 100 nm.

Figure 4:
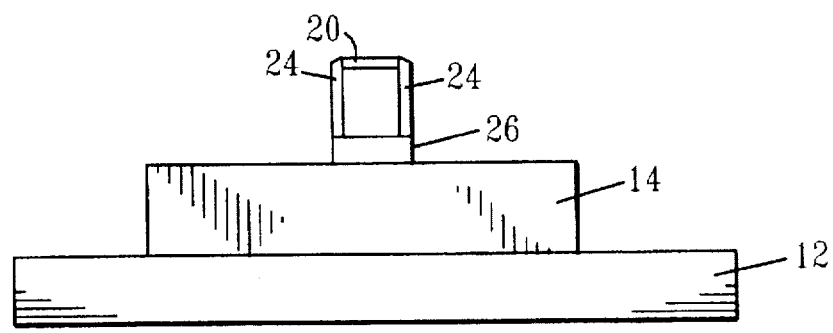
FIG. 4 is a side elevational view of the stacked pillar region formed on the bottom layer of the structure of FIG. 1.
Figure 6:
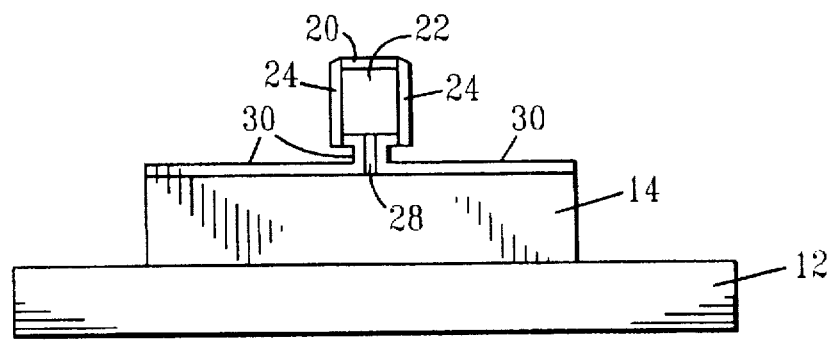
FIG. 6 is a side elevational view shown with the channel region formed in the middle layer of the structure of FIG. 4.
Figure 5:
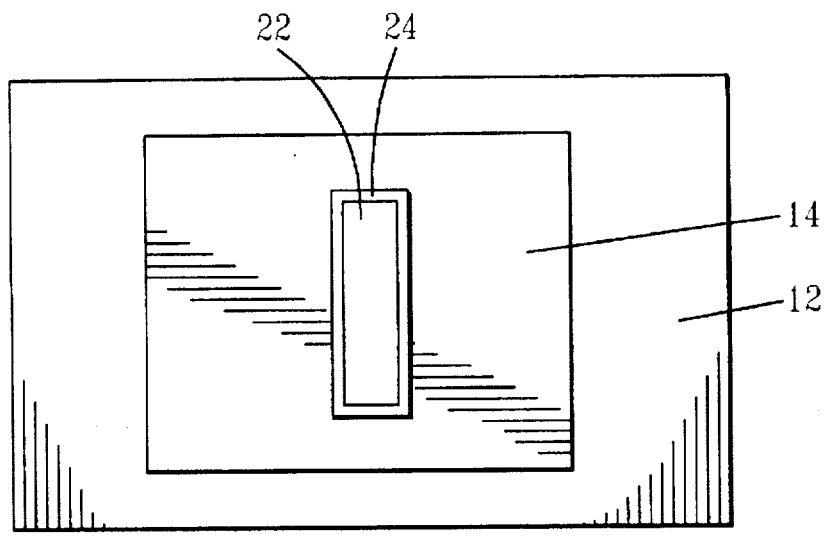
FIG. 5 is a top view of the structure of FIG. 4.

FIG. 5 is a top view of the structure shown in FIG. 4 after the middle layer 16 has been etched to form the stacked pillar regions 22, 26.

A gate oxide layer 30 is formed around the channel region 28 by thermal growth of an ultra thin oxide of about 3 nm. The oxide layer 30 will also form on the exposed surfaces of region 22 and layer 14.

Figure 7:
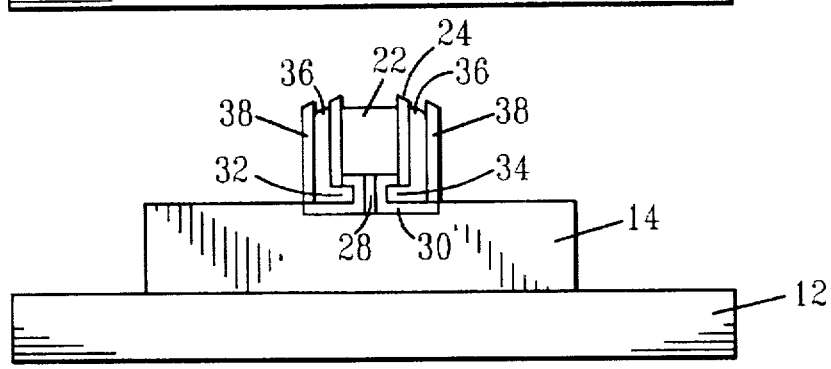
FIG. 7 is a side elevational view of the dual gate field effect transistor of the present invention.

FIG. 7 shows the final structure in which gate regions 32 and 34 are formed. The gate regions 32 and 34 are formed on the sidewalls of the pillar by conformal deposition and etchback of polysilicon 36. The polysilicon may be doped in situ during deposition for control of the gate work function. The sidewall 24 and cap 20 may be removed by a selective wet edge. While polysilicon is the preferred material, other suitable gate materials include tungsten, tungsten-silicon alloys, aluminum, or other similar materials.

Figure 8:
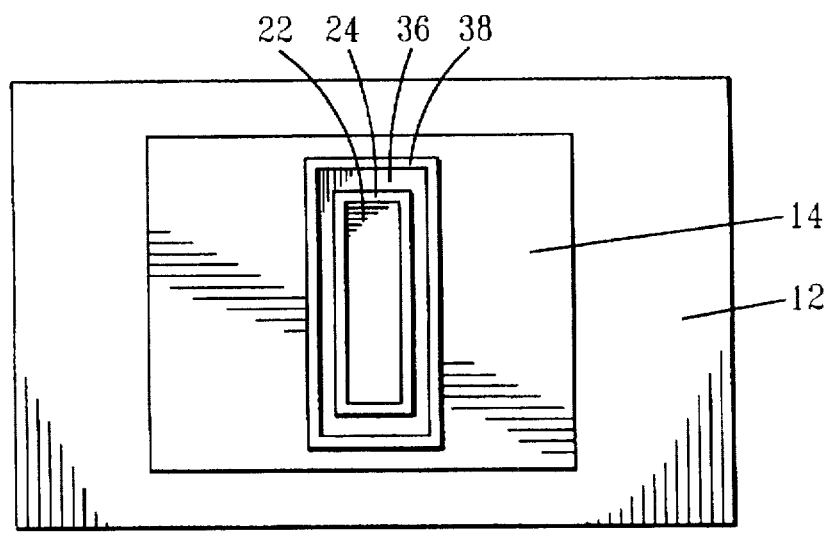
FIG. 8 is a top view of the structure of FIG. 7.

FIGS. 7 and 8 show side and top views of the final structure. Region 22 forms the source and layer 14 forms the drain with channel 28 extending between the source and drain regions. Contacts to the source, drain and gates may be made in the third dimension, facilitated by an additional dielectric sidewall spacer 38. Device isolation may be accomplished by conventional oxidation, such as by a recessed oxide scheme, by trench isolation or by depositing the layers on an insulating (or reverse-type) substrate.

The device of the present invention may also be implemented in III–V materials. In one such embodiment, the top and bottom layers would be formed of GaAs and the middle layer would be GaAlAs. Alternatively, the top and bottom layers would be GaAlAs and the middle layer would be GaAs. In such an embodiment, the first and second gate regions 32 and 34 would each include metal in contact with the channel forming a Schottky barrier diode with the channel.

The dual gate field effect transistor of the present invention is usable in high performance, low power logic and memory applications. The channel region for example could have a volume wherein the channel functions as a single electron transistor (SET). The channel region could also have a volume to function as a quantum wire. The channel region can also have a volume to function as a quantum dot.

In the device of the present invention, the dual gates on either side of the channel influence the same electrons in the thin channel for higher speeds and to avoid short channel effects. The difference in semiconductor material between the middle layer and top and bottom layers provide selective lateral etching of the middle layer. The dual gate MOSFET of the present invention is a vertical, thin channel silicon device. Such a dual gate thin SOI device is a preferred way to achieve CMOS scaling.

While the invention has been particularly shown and described with respect to illustrative and preferred embodiments thereof, it will be understood by those skilled in the art that the foregoing and other changes in form and details may be made therein without departing from the spirit and scope of the invention which should be limited only by the scope of the appended claims.

What we claim as new and desire to secure by Letters Patent is:

1. A vertical dual gate field effect transistor comprising:
    a first region of a first semiconductor material having a first conductivity type forming a source;
    a second region of a second semiconductor material having a second conductivity type forming a channel extending vertically from said first region to a third region of a third semiconductor material, said second region having first and second opposed sidewalls, said first and second opposed sidewalls being spaced apart substantially uniformly to form said channel having a width in the range from 2.5 to 100 nm, said second semiconductor material being different from said first semiconductor material;
    said third semiconductor material having said first conductivity type forming a drain, said third semiconductor material being different from said second semiconductor material; and
    first and second gate regions positioned on said first and second sidewalls respectively of said second region.

2. The dual gate field effect transistor of claim 1, wherein said first region of semiconductor material comprises silicon.

3. The dual gate field effect transistor of claim 1, wherein said first region of semiconductor material comprises silicon germanium alloy.

4. The dual gate field effect transistor of claim 1, wherein said first region of semiconductor material is doped to a concentration of $0.8 \times 10^{18}/cm^3$ or greater.

5. The dual gate field effect transistor of claim 1, wherein said second region of semiconductor material comprises silicon.

6. The dual gate field effect transistor of claim 1, wherein said second region of semiconductor material comprises silicon germanium alloy.

7. The dual gate field effect transistor of claim 5, wherein said third region of semiconductor material comprises silicon germanium alloy.

8. The dual gate field effect transistor of claim 6, wherein said third region of semiconductor material comprises silicon.

9. The dual gate field effect transistor of claim 1, wherein said third region of semiconductor material is doped greater than $0.8 \times 10^{18}/cm^3$.

10. The dual gate field effect transistor of claim 1, wherein a length of said channel extending from said first region to said third region is less than 200 nm.

11. The dual gate field effect transistor of claim 1, wherein said first and third region of semiconductor material comprise silicon and said second region of semiconductor material comprises silicon germanium alloy.

12. The dual gate field effect transistor of claim 1, wherein said first and third region of semiconductor material comprise silicon germanium alloy and said second region of semiconductor material comprises silicon.

13. The dual gate field effect transistor of claim 1, wherein said second region includes a first and second layer of dielectric on each of said first and second sidewalls, respectively, and a layer of polysilicon on each of said first and second layers of dielectric, respectively, said first and second layers of polysilicon forming said first and second gate regions.

14. The dual gate field effect transistor of claim 1, wherein said first and third semiconductor materials are different.

15. The dual gate field effect transistor of claim 1, wherein said first and third semiconductor materials are the same.

16. The dual gate field effect transistor of claim 1, wherein said second region has a volume such that the channel functions as a single electron transistor (SET).

17. The dual gate field effect transistor of claim 1, wherein said second region has a volume such that the channel functions as a quantum wire.

18. The dual gate field effect transistor of claim 1, wherein said second region has a volume such that the channel functions as a quantum dot.

19. The vertical dual gate field effect transistor of claim 1, wherein said first and second gate regions influence same electrons in said channel.

20. The vertical dual gate field effect transistor of claim 1 further comprising first and second insulating regions formed between said first and second opposed sidewalls and said first and second gate regions, respectively, said first and second insulating regions each having a thickness of approximately 3 nm.

21. A vertical dual gate field effect transistor comprising:
    a channel formed of first semiconductor material positioned between a drain and source of second and third semiconductor materials positioned above and below said channel, respectively;
    said first, second and third semiconductor materials being single crystal and in epitaxial relationship to one another;
    said first and third semiconductor materials being doped with a first conductivity type, said second semiconductor material being doped with a second conductivity type;
    said channel having a substantially uniform thickness between first and second sidewalls, said first and second sidewalls being spaced apart to form said channel having a width in the range from 2.5 to 100 nm;
    first and second gate regions positioned on said first said second sidewalls, respectively; and
    said first and third semiconductor materials being different from said second semiconductor material to enable selective etching of said second semiconductor material relative to said first and third semiconductor materials.

22. The dual gate field effect transistor of claim 21, wherein said first and second gate regions each include metal in contact with said channel forming a Schottky barrier diode with said channel.

23. The dual gate field effect transistor of claim 21, wherein said first and third semiconductor material comprises GaAs.

24. The dual gate field effect transistor of claim 21, wherein said second semiconductor material comprises GaAlAs.

25. The dual gate field effect transistor of claim 23, wherein said second semiconductor material comprises GaAlAs.

26. The dual gate field effect transistor of claim 24, wherein said first and third semiconductor material comprises GaAs.

27. The vertical dual gate field effect transistor of claim 21, wherein said first and second gate regions influence same electrons in said channel.

28. The vertical dual gate field effect transistor of claim 19 further comprising first and second insulating regions formed between said first and second opposed sidewalls and said first and second gate regions, respectively, said first and second insulating regions each having a thickness of approximately 3 nm.

* * * * *